(12) United States Patent
Simpson et al.

(10) Patent No.: US 6,374,325 B1
(45) Date of Patent: Apr. 16, 2002

(54) CONTENT ADDRESSABLE MEMORY (CAM)

(75) Inventors: Richard David Simpson, Carlton; Laura Simmonite, Milton Keynes, both of (GB); Graham McLeod Barr, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/251,517

(22) Filed: Feb. 17, 1999

Related U.S. Application Data
(60) Provisional application No. 60/074,949, filed on Feb. 17, 1998.

(51) Int. Cl.[7] .............................................. G06F 12/00
(52) U.S. Cl. ........................ 711/108; 711/158; 711/170
(58) Field of Search ................................ 711/108, 158, 711/170; 365/49, 230.03

(56) References Cited

U.S. PATENT DOCUMENTS

| | | | |
|---|---|---|---|
| 4,888,731 A | | 12/1989 | Chuang et al. ................. 365/49 |
| 4,928,260 A | | 5/1990 | Chuang et al. ................. 365/49 |
| 5,126,968 A | * | 6/1992 | Hamamoto et al. ............ 365/49 |
| 5,319,589 A | * | 6/1994 | Yamagata et al. ............. 365/49 |
| 5,339,268 A | * | 8/1994 | Machida ........................ 365/49 |
| 5,383,146 A | | 1/1995 | Threewitt ...................... 365/49 |
| 5,388,066 A | | 2/1995 | Hamamoto et al. ............ 365/49 |
| 5,642,322 A | * | 6/1997 | Yoneda .................... 365/230.03 |
| 5,818,786 A | * | 10/1998 | Yoneda .................... 365/230.03 |
| 5,943,252 A | * | 8/1999 | Schultz et al. ................. 365/49 |
| 6,098,147 A | * | 8/2000 | Mizhuhara ................... 711/108 |
| 6,101,116 A | * | 8/2000 | Lien et al. ................... 711/108 |
| 6,108,747 A | * | 8/2000 | Kaganoi ...................... 711/108 |

OTHER PUBLICATIONS

"Extending the CacheCAM™ Camparand Width", Ray Parry, Music Semiconductors, May 28, 1997, Rev. 0.5 Web, 2 pages.

"What Is A CAM (Content–addressable Memory)?", Ray Parry, Music Semiconductors, May 28, 1997, Rev. 1.5 Web, 2 pages.

* cited by examiner

*Primary Examiner*—Matthew Kim
*Assistant Examiner*—Fred F. Tseng
(74) *Attorney, Agent, or Firm*—J. Dennis Moore; W. James Brady, III; Frederick J. Telecky, Jr.

(57) ABSTRACT

A content addressable memory (CAM) system (50) is disclosed which includes a CAM array (52) for storing an array of data words. More than one data word is stored on each row with the bits of the data word columns interleaved with each other. The CAM array (52) is accessed during one of several modes of operation in accordance with signals from a bit line controller (54) which activate certain ones of a plurality of bit lines coupling the bit line controller (54) to the CAM array (52). The modes of operation, as indicated by a mode control signal, include a write mode, a read mode and a match mode. In first embodiment of the present invention, the bit line controller (54) sequentially accesses each of the columns of data words by selectively activating certain of the bit lines in accordance with a column address signal and the mode control signal.

6 Claims, 3 Drawing Sheets

CONTENT ADDRESSABLE MEMORY (CAM)

This amendment claims priority under 35 USC § 119(e)(1) of provisional application number 60/074,949, filed Feb. 17, 1998.

TECHNICAL FIELD OF THE INVENTION

The present invention relates generally to computer memories, and more particularly to a content addressable memory with reduced size, power, and access time and increased floor planning flexibility.

BACKGROUND OF THE INVENTION

Random access memory (RAM) is the memory most often used in current electronic systems. In a RAM, the address of data is provided on an address bus and the corresponding data is then retrieved. The width of the address bus determines how many memory locations can be addressed and thus determines the size of the memory.

Another type of memory is content addressable memory (CAM). In a CAM, the data itself is provided in a special register. The CAM is then searched for the data by comparing each bit of the data with each bit of the information stored in the CAM. If a match is found, a match flag is set to indicate that the data was found. A priority encoder then prioritizes the matching locations (if more than one match was found) and generates the corresponding address of the highest priority matching location. One application for the CAM is in a memory cache system in which the matching process is used to determine whether the cache includes data needed elsewhere, such as data requested by a processor.

Since the CAM is searched based on the contents of the memory location rather than based on the data location in the memory, and further, since the same data content may be found in more than one location in the CAM, the CAM is also useful in applications in which it is desirable to retrieve multiple items from memory simultaneously. The highly parallel nature of content addressing is also an advantageous feature useful, for example, in processing high level algorithmic functions. Use of the CAM in these types of applications, however, also generally requires much larger CAMs than typically used in a cache. For smaller CAMs such as those used in cache applications, a primary concern is fast, efficient access and thus, the focus is on optimizing the access method to minimize latency. In larger CAMs, however, where the objective is to support a large number of entries, attention must be focused on maintaining an efficient layout shape and a reasonable bandwidth.

FIG. 1 shows an architectural diagram of a prior art CAM array 100. The prior art CAM array 100 consists of 1024 words, each word having 56 bits. Each row in the CAM array 100 represents one of the 1024 words. Each of the 56 columns in the CAM array 100 represents one bit in each of the 1024 words. Thus, as shown in the prior art CAM array 100, a long, narrow memory structure is typically used. In systems which include a CAM array such as that shown in FIG. 1, the CAM array may be extended to increase memory capacity by adding more rows. This long, narrow structure, however, not only becomes increasingly cumbersome as more capacity is added but also severely impacts the layout of the floor plan of any device in which it is used.

Other prior art CAM systems do little to alleviate these types of problems. Most, such as the systems described in U.S. Pat. Nos. 4,888,731, 4,928,260, and 5,388,066, simply provide more efficient methods of storing data and/or accessing data stored in the CAM array while still utilizing the conventional long, narrow architecture. Another such prior art CAM system such as described in the article entitled "Extending The CacheCAM™ Comparand Width" by Ray Parry, published by Music Semiconductor, AB-N6, concatenates adjacent entries of the typical long, narrow CAM array structure using validity bits to identify successive entries.

What is needed is a simple, easy to implement method and system for managing a CAM having a large number of entries while still maintaining an efficient layout shape and a reasonable bandwidth.

SUMMARY OF THE INVENTION

The present invention is a content addressable memory (CAM) system, having a CAM array operable to store a number of data words, each of the data words having a number of bits. The CAM is made up of rows and columns of CAM cells, each CAM cell operable to store one of the bits of one of the data words. Each row of the CAM system of the present invention stores the bits of at least two of the data words. The bits of the at least two data words on a single row are interleaved. Using a time multiplexing technique, the CAM system of the present invention accesses each of the data words on the row in turn during one of a number of cycles.

In another aspect of the present invention, a portion of the content of the data words is used to determine where on the row the data word is stored and, thus, reduces the number of cycles required to search for a particular data word.

DETAILED DESCRIPTION OF THE INVENTION

Figure 1:
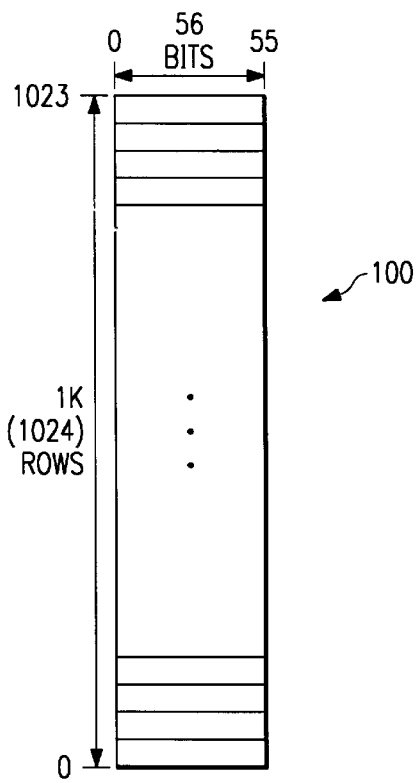
FIG. 1 shows a memory storage structure of a prior art content addressable memory (CAM)
Figure 2:
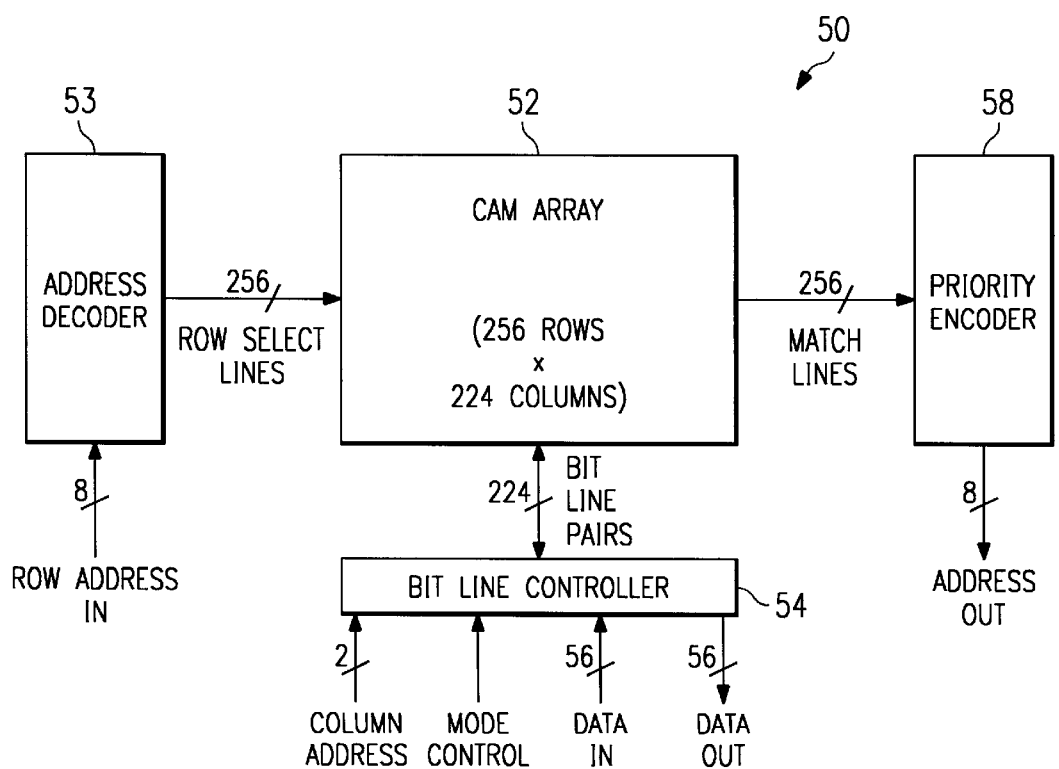
FIG. 2 is a block diagram illustrating a CAM system in accordance with the present invention.

FIG. 2 illustrates a CAM system 50 in accordance with the present invention. The CAM system 50 shown in FIG. 2 includes a CAM array 52 which, although other similarly proportioned dimensions can be used as will be understood from the description hereinbelow, is comprised of 57,344 CAM cells arranged in 256 rows and 224 columns. The CAM array 52 is bi-directionally coupled to a bit line controller 54 by 224 bit line pairs, each bit line pair connecting one of the columns of CAM cells in the CAM array 52. The 224 bit line pairs are selectively enabled by the bit line controller 54 in one embodiment of the present invention in accordance with a 2-bit 'column address' signal and a 'mode control' signal. The 'column address' signal being provided by a cycle counter, not shown. In another embodiment of the present invention, the 224 bit line pairs are selectively enabled by the bit line controller 54 in accordance with the 'column address' signal, the 'mode control' signal and a 56-bit 'data in' signal. The 56-bit 'data in' signal provides data to be stored in or matched to data stored in the CAM array 56. A 56-bit 'data out' signal returns data retrieved from the CAM array 52.

The CAM array 52 is also connected to an address decoder 53 by 256 row select lines and to a priority encoder 58 by 256 match lines. The 256 row select lines are each connected to one row of CAM cells in the CAM array 52 which are selectively enabled in accordance with a 8-bit 'row address in' signal decoded by the address decoder 53. The priority encoder 58 generates an 8-bit 'address out' signal to indicate the location in the CAM array 52 of matching data in accordance with the 256 match lines. Operation of the CAM system 50 is discussed in more detail hereinbelow.

The CAM system 50 of the present invention has three modes of operation as shown hereinbelow in Table 1. The three modes of operation, as indicated by the mode control signal, are data write, data read, and match. In the data write mode, the bit line controller 54 is operable to cause data to be written into selected CAM cells in the CAM array 52 in accordance with a row address provided by the 'row address in' signal, and a column address provided by the 'column address in' signal. Since multiple data words can be stored in each row of the CAM array 52, the column address is used to determine which of the data words on the selected row to use. The content of the data word to be stored in the CAM array 52 is provided by the 'data in' signal.

In the data read mode, data is read from selected CAM cells in the CAM array 52 in accordance with a row address provided by the 'row address in' signal and a column address provided by the 'column address in' signal. The corresponding stored data word is then retrieved, passed to the bit line controller 54 and is then provided as output by the 'data out' signal.

In the match mode, target data, provided on the 'data in' signal is searched for in the CAM array 52. A column address is again provided by the 'column address in' signal. The match operation is performed sequentially across selectively enabled ones of the columns using a time multiplexing technique, discussed in more detail hereinbelow. Indication of the match or matches found are provided to the priority encoder 58. The resultant address of the highest priority matching data word, since multiple matches may be found, is provided by the priority encoder 58 using the 'address out' signal.

TABLE 1

| Mode Control | Row Address In | Column Address In | Data In | Data Out | Address Out |
|---|---|---|---|---|---|
| Write | X | X | X | X | |
| Read | X | X | X | | X |
| Match | X | | X | X | | X |

Figure 3:
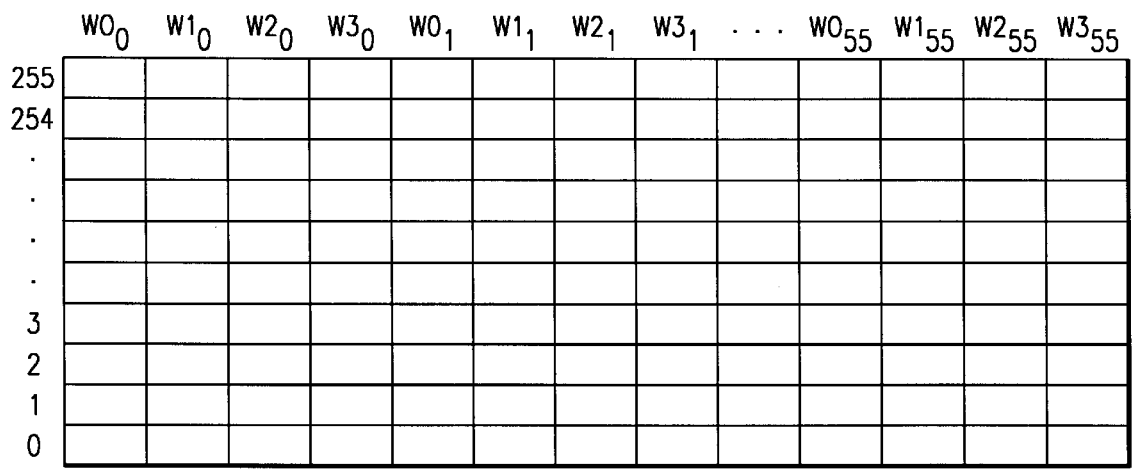
FIG. 3 illustrates in detail an exemplary CAM array in accordance with the present invention.

FIG. 3 illustrates an exemplary structure of the CAM array 52 used in the CAM system 52 in accordance with the present invention. Instead of having one 56 bit data word per row in the CAM array 52, the CAM array 52, as shown in detail in FIG. 3, includes four data words per row. Each data word has 56 bits which are interleaved with the bits of the other data words on the same row. Thus, as illustrated in FIG. 3, bit 0 of data word 0 ($W0_0$) is adjacent to bit 0 of data word 1 ($W1_0$). Bit 0 of data word 1 ($W1_0$) is adjacent to bit 0 of data word 2 ($W2_0$). Bit 0 of data word 2 ($W2_0$) is adjacent to bit 0 of data word 3 ($W3_0$). Bit 0 of data word 3 ($W3_0$), since only four data words are shown in FIG. 3 by way of example, is then adjacent to bit 1 of data word 0 ($W0_1$). As will be discussed in more detail hereinbelow in connection with the discussion of FIG. 5, interleaving the bits of each data word stored on a row provides for an efficient floor plan layout of the CAM array 52.

This pattern of interleaving the bits of each data word continues until all bits of all data words on that row are represented. Although only four 56-bit data words are shown on each row in the exemplary CAM array 52 shown in FIG. 3, it is contemplated that any number of data words of any desired bit width may be used. The time multiplexing technique, discussed in more detail hereinbelow, for accessing the data words may be adjusted accordingly.

Figure 4:
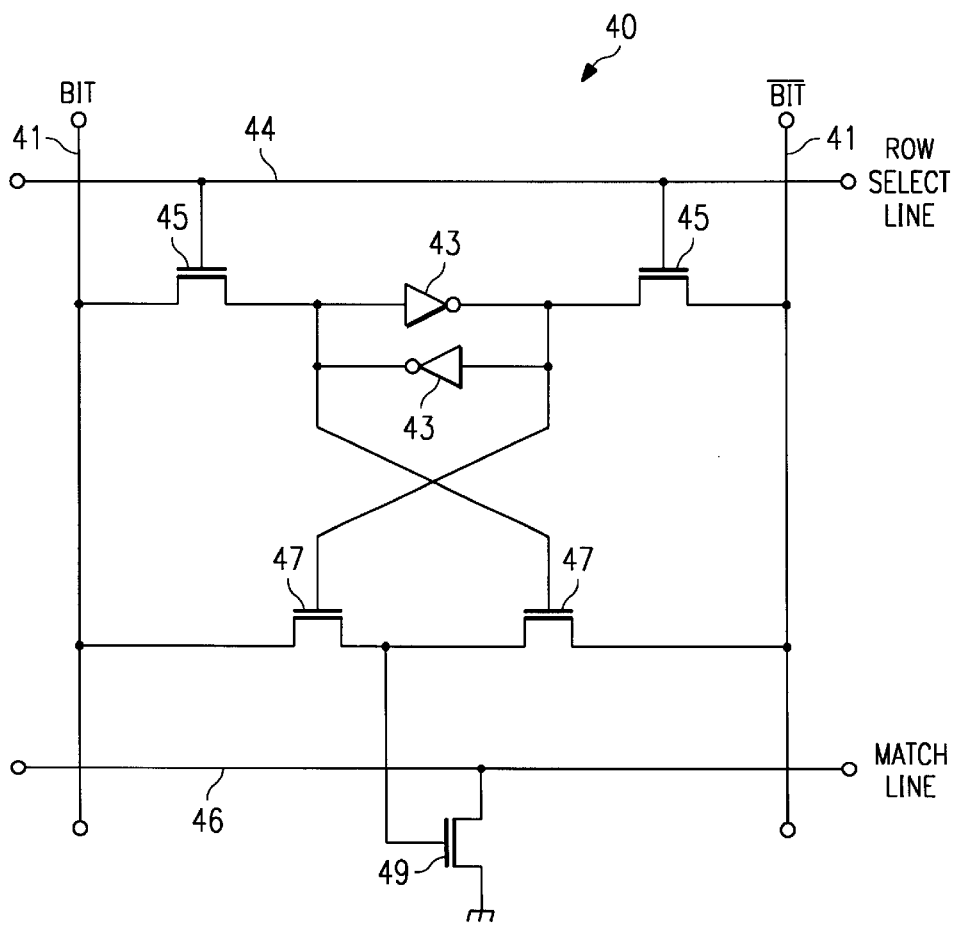
FIG. 4 shows a detailed diagram of a CAM cell in accordance with the present invention.

FIG. 4 shows a detailed diagram of a CAM cell 40 in accordance with the present invention. The CAM cell 40 includes a bit storage circuit which is operable to store one bit of one data word. The bit storage circuit is comprised of a pair of inverters 43 forming a flip-flop, the upper inverter's output determining memory output. Each inverter 43 has an input which is coupled to the other's output and to a pair of bit lines 41 by a corresponding normally-open transistor switch 105 which is controlled by a gate coupled to a row select line 44. To write a bit to the CAM cell 40, i.e., during a data write operation, the bit and its complement (BIT and $\overline{\text{BIT}}$) are set on the bit lines 41, and a logical '1' signal is placed on the row select line 44 to close the switches 45.

The CAM cell 40 also includes a bit compare circuit which is operable to perform a comparison of the bit stored in the CAM cell 40 with a corresponding bit of a target data word, i.e., during a data match operation. The bit compare circuit is comprised of a three transistor comparator formed by transistors switches 47 and 49. Each switch 47 is controlled by a gate coupled to the output of a corresponding inverter 43 and a source coupled to a corresponding row select line 41. Switch 49 couples the switches 47 to the match line 46 and to ground.

The match line 46 is initially pre-charged to logical '1' or HIGH. To compare a bit of the target data word to the bit stored in the CAM cell 40, the target data bit and its complement are set on the bit lines 41 of the CAM cell 40. The bit compare circuit generates a cell output signal which indicates the result of the comparison. If there is a mismatch between the bit stored in the CAM cell 40 and the target data bit, the cell output signal causes the match line 46 to discharged to ground through switch 49. Otherwise, the bit compare circuit of that CAM cell 40 has no effect on the charge of the match line 46.

All of the CAM cells 40 on the same row in the CAM array 52 share a common match line 46 and thus, during a match operation, the bit lines 41 apply all of the bits of the target data word in parallel to the selectively enabled CAM cells 40 in each row of the CAM array 52. If any enabled CAM cell 40 has a mismatch, it discharges that row's match line 46 to ground. If, however, all of the bits of the enabled CAM cells 40 on a row match their corresponding bit in the target data word, the match line 46 for that row remains at logical '1' or HIGH.

By the same token, all of the CAM cells 40 in one column in the CAM array 52 share a common pair of bit lines 41. Each of the bit line pairs connects a column of CAM cells and provides each bit of the data word and its inverse to selected columns of CAM cells in the CAM array 52 for storage during the data write operation and provides the corresponding bit of the target data word and its inverse to selected columns of CAM cells for comparison during the match operation and accepts the bits of a stored data word retrieved as a result of the data read operation.

Thus, during a match operation, the bit lines 41 simultaneously apply each of the bits of a target data word in parallel to the selectively enabled CAM cells 40 of all rows. Any CAM cell in a row having a mismatch discharges its corresponding matchline 46 to logical '0' or LOW, but a row having all matching CAM cells 40 maintains its match line 46 at logical '1' or HIGH. By inputting all of the match lines 46 to an OR gate, not shown, the output of the OR gate provides a global match indicator signal, not shown, is provided for the CAM array 52.

Returning to FIG. 2, since the CAM array 52 has four interleaved data words stored on each row in a first embodiment of the present invention, the CAM system 50 of the present invention uses four cycles to perform the match operation. By way of example, a first cycle is indicated when the 'column address in' signal has a value of '00'. A second cycle is indicated when the 'column address in' signal has a value of '01'. A third cycle is indicated when the 'column address in' signal has a value of '10'. And, a fourth cycle is indicated when the 'column address in' signal has a value of '11'.

During one of the four cycles indicated by the 'column address in' signal, the CAM controller simultaneously activates the CAM cells corresponding to data word 0 on each row. During a second of the four cycles, the bit line controller 54 simultaneously activates the CAM cells corresponding to data word 1 on each row. During a third of the four cycles, bit line controller 54 simultaneously activates the CAM cells corresponding to data word 2 on each row. Finally, during a fourth of the four cycles, the bit line controller 54 simultaneously activates the CAM cells corresponding to data word 3 on each row.

Thus, at least four cycles are required during the match operation to ensure either finding the target data word or determining that the target data word is not present in the CAM array 52 in that the bit line controller 54 is time multiplexed to provide the target data to only one of the four data words on each row during each cycle. Thus, only one of the four possible bit line pairs for each bit position (since four interleaved data words are stored on each row in the CAM array 52) is active during any one match cycle. The other three pairs of bit lines (which represent the same bit for the other three data words on the same row) are held LOW, at '00'. With both bit lines in the bit line pair (BIT and $\overline{\text{BIT}}$) held LOW, the compare circuit in the CAM cell does not operate and thus will not cause the match line to discharge. The four cycles are thus required to sequentially allow each of the four bit line pairs corresponding to a bit position of each of the four data words stored on a single row to be active while the others are inactive.

In a second embodiment of the CAM system 50 of the present invention, no more than two lookup operations are required to ensure either finding the target data word or determining that the target data word is not present in the CAM array 52. In the second embodiment of the present invention, during the match operation, the bit line controller 54 is operable to supply the target data word to more than one of the data words on each row during each cycle. Thus, in the second embodiment of the CAM system 50 of the present invention, the mux factor is not the same as the mux factor in the first embodiment of the present invention.

In the second embodiment of the CAM system 50 of the present invention, the bit line controller 54 is operable to use some property of the target data word, e.g., the least significant bit or any other bit or the parity of any combination of bits, to determine in which of the data words on the selected row to store the data. If, for example, the parity of the least significant bit is used, then even data could be stored in data word 0 or in data word 1 and odd data could be stored in data word 2 or in data word 3. Thus, only two cycles are required to locate the data during a match operation. If the target data is even, data word 0 is searched during the first cycle and data word 1 is searched in the second cycle. If the target data is odd, then data word 2 is searched in the first cycle and data word 3 is searched during the second cycle.

If the bit line controller 54 uses two bits of the data to determine in which data word on a selected row to store the data during the data write operation, then only one cycle is needed to search for data during the match operation. As an example, if the two least significant bits of the data are used to determine in which data word to store the data, then if the two least significant bits of the data are '00', the data is stored in data word 0, if the two least significant bits of the data are '01', the data is stored in data word 1, if the two least significant bits of the data are '10', the data is stored in data word 2, and if the two least significant bits of the data are '11', the data is stored in data word 3. By the same token, during the match operation, the two least significant bits in the target data are used to determine which data word on each row to search in the CAM array 52. Thus, only one lookup cycle is required to search for the target data in the CAM array 52.

Figure 5:
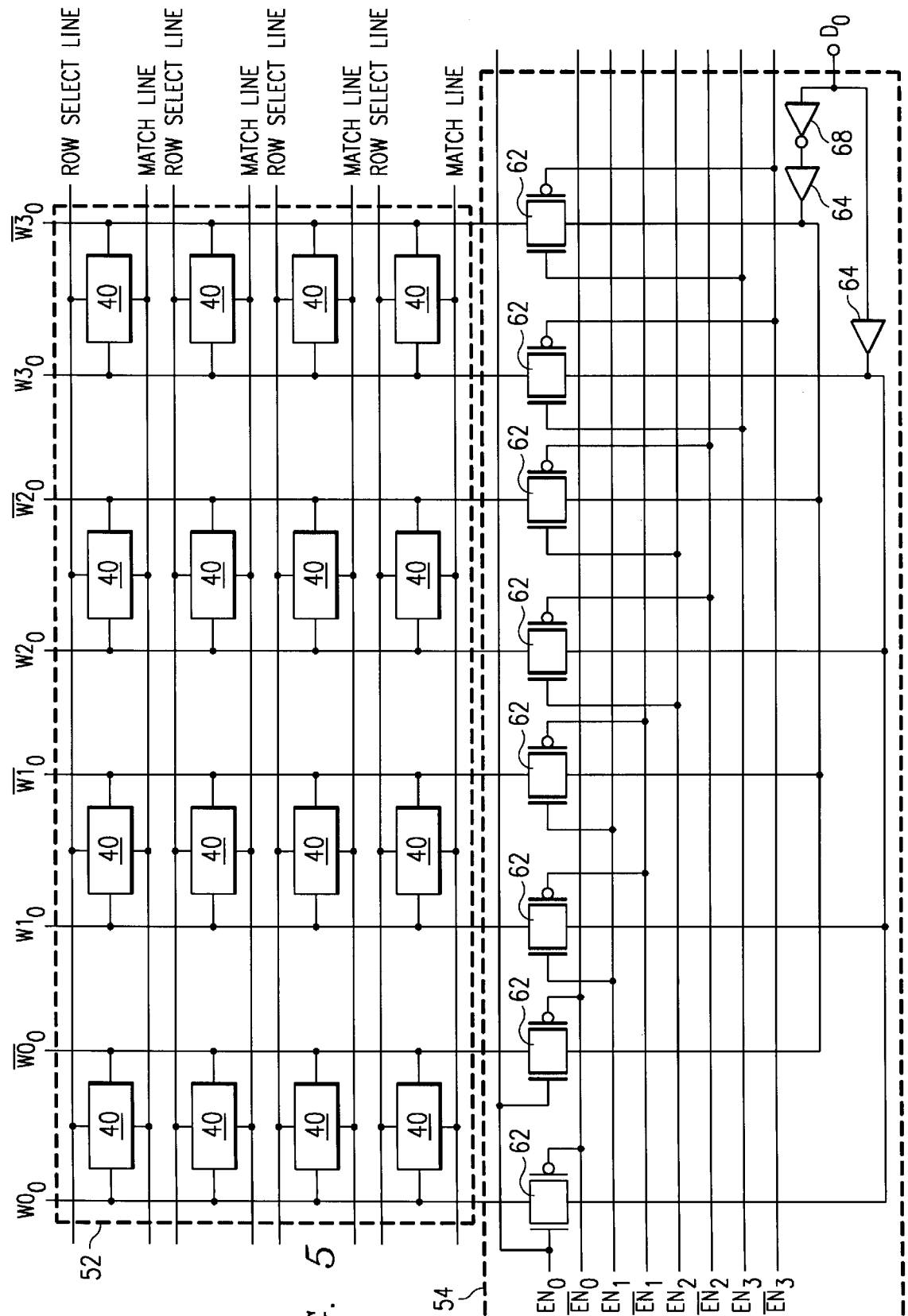
FIG. 5 is a detailed block diagram of a portion of the CAM system of the present invention.

FIG. 5 is a block diagram illustrating in more detail the control flow between the CAM array 52 and the bit line controller 54. Using the exemplary CAM array 52 shown in FIG. 3 which stores four interleaved 56-bit data words on each row, FIG. 5 shows four columns and four rows of the CAM array 52. In other words, FIG. 5 shows the CAM cells 40 for bit 0 of the four data words stored on each of four rows in the CAM array 52. Bits 1–55 of the four data words, not shown, would be similarly structured for each row.

Also shown in FIG. 5 is a detailed portion of the bit line controller 54. Included in the bit line controller 54 is a number of CMOS transmission gates 62, each of which couples each bit $D_n$ and its complement $\overline{D_n}$ of a target data word to bit n and its complement $\bar{n}$, respectively, of each data word stored on a row of the CAM array 52. In FIG. 5, $D_0$ and $\overline{D_0}$, generated using inverter 68, are shown connected to their respective CMOS transmission gates 62 through sense amps 64.

Each of the CMOS transmission gates 62 shown in FIG. 5 are comprised of parallel n-channel and p-channel CMOS transistors. The n-channel side of each of the CMOS transmission gates 62 is connected to an enable signal, EN. The p-channel side of each of the CMOS transistors 62 is connected to the complement of the associated enable signal, $\overline{\text{EN}}$. There is one enable signal, EN, for each data word stored on a row in the CAM array 52. Thus, in the exemplary CAM array 52 which has four data words stored on each row, there are four enable signals, $EN_0$, $EN_1$, $EN_2$, and $EN_3$, each of which corresponds to a particular data word. Thus, in the first embodiment of the present invention, assuming that when the column address signal has a value of '00' data word 0 (W0) is selected, the bit line controller 54 sets enable signal $EN_0$ to logical '1', or HIGH which activates all bit positions of data word 0 ($W0_0$ through $W_{55}$), while the other three enable signals, $EN_1$, $EN_2$, and $EN_3$, are set to logical '0' or LOW. In the second embodiment of the present invention, where some property of the target data word is used to determine which data word column to write to, read from or match to, the column address signals are generated by the bit line controller 54 using the selected property.

As can be seen in FIG. 5, by interleaving the bits of the data words stored on each row, a more efficient floor plan layout is achieved. The bit lines which provide exemplary data bit $D_0$ of the target data word can be located closely with the same bit of all the data words stored in the CAM array 52, even though multiple data words are stored on each row.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the arts in which the invention pertains. It is, therefore, contemplated that the appended claims will cover all modifications that fall within the true scope of the invention.

What is claimed is:

1. A content addressable memory (CAM) system, comprising:
   a CAM array of CAM cells, said CAM array having a number of rows and a number of data words on each row;
   an address decoder, coupled to said CAM array by a number of row select lines, said address decoder operable to selectively activate certain of said rows in accordance with a row address signal;
   a bit line controller, coupled to said CAM array by a number of bit line pairs, said bit line controller operable to selectively activate certain data words on said selectively activated rows in accordance with a column address signal;
   each of said CAM cells operable to store data to, compare data with and retrieve data from said selectively activated data words on said selectively activated rows, said CAM cells further operable to generate signals on a number of match lines to indicate results of said comparison;
   a priority encoder, coupled to said CAM array by a number of match lines, said priority encoder operable to generate an output row address in accordance with a highest priority matching row in said CAM array as indicated by said match lines.

2. The CAM system of claim 1 wherein said data word columns are interleaved, each bit of each data word on a selected row is located adjacent to similarly positioned bits from all other data words on said selected row.

3. The system of claim 1 wherein said bit line controller is further operable to store said data words in said CAM array in and selectively activate certain data words on said selectively activated rows in accordance with a property of a target data word.

4. A method of storing, locating and retrieving data from a CAM array, comprising the steps of:
   storing the data in the CAM array, the CAM array comprised of a number of CAM cells arranged in a number of rows, each of said rows comprised of a number of columns of data words;
   locating the data in the CAM array by sequentially comparing a target data word with each of said columns of data words in accordance with a column address signal; and
   retrieving the data from the CAM array in accordance with a number of match lines, said match lines operable to indicate the results of said comparison.

5. The method of claim 4 where said storing step includes the step of storing the data in the CAM array, each of said rows comprised of a number of interleaved columns of data words, each bit of each data word on said each row located adjacent to similarly positioned bits from all other data words on said each row.

6. The method of claim 4 wherein said storing, locating and retrieving steps include the steps of storing the data in, locating the data in and retrieving the data from the CAM array in accordance with a property of the data.

* * * * *